(12) United States Patent
Oddoart et al.

(10) Patent No.: US 8,085,954 B2
(45) Date of Patent: Dec. 27, 2011

(54) MICROPHONE AMPLIFICATION ARRANGEMENT AND INTEGRATED CIRCUIT THEREFOR

(75) Inventors: Ludovic Oddoart, Frouzins (FR); Jerome Enjalbert, Fonsorbes (FR)

(73) Assignee: Freescale Semiconductor, Inc., Austin, TX (US)

( * ) Notice: Subject to any disclaimer, the term of this patent is extended or adjusted under 35 U.S.C. 154(b) by 985 days.

(21) Appl. No.: 11/996,244

(22) PCT Filed: Jul. 21, 2005

(86) PCT No.: PCT/EP2005/009177
§ 371 (c)(1),
(2), (4) Date: Jan. 18, 2008

(87) PCT Pub. No.: WO2007/009483
PCT Pub. Date: Jan. 25, 2007

(65) Prior Publication Data
US 2008/0226100 A1 Sep. 18, 2008

(51) Int. Cl.
*H03F 99/00* (2009.01)
(52) U.S. Cl. ........................ 381/120; 381/118
(58) Field of Classification Search .................... 381/120
See application file for complete search history.

(56) References Cited

U.S. PATENT DOCUMENTS

| 2,342,822 A | 2/1944 | Rumpel |
| 4,110,692 A | 8/1978 | Pradal et al. |
| 5,202,918 A | 4/1993 | White et al. |
| 5,218,642 A * | 6/1993 | Chin-Fa .......................... 381/83 |
| 2006/0044961 A1* | 3/2006 | Jin .............................. 369/44.13 |
| 2006/0261892 A1* | 11/2006 | Sutardja ........................ 330/253 |

FOREIGN PATENT DOCUMENTS

EP 0756374 A 1/1997

* cited by examiner

*Primary Examiner* — Kiesha Bryant
*Assistant Examiner* — Igwe U Anya

(57) ABSTRACT

A microphone amplifier arrangement comprises at least one microphone input connected to a dual output microphone pre-amplifier having an input resistance comprising a first resistance and a second resistance in a first voltage-to-voltage mode of operation, and only the second resistance in a second current-to-voltage mode of operation. A first output is operably coupled to a first feedback path comprising a V2V feedback resistor; and a second output is operably coupled to a second feedback path comprising an I2V feedback resistor. In this manner, the microphone amplifier arrangement is arranged to support both a V2V microphone amplifier and a low-noise I2V microphone amplifier.

20 Claims, 2 Drawing Sheets

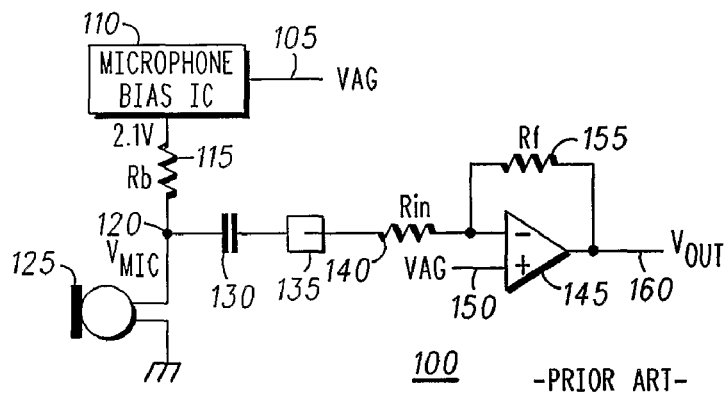
FIG. 1 -PRIOR ART-
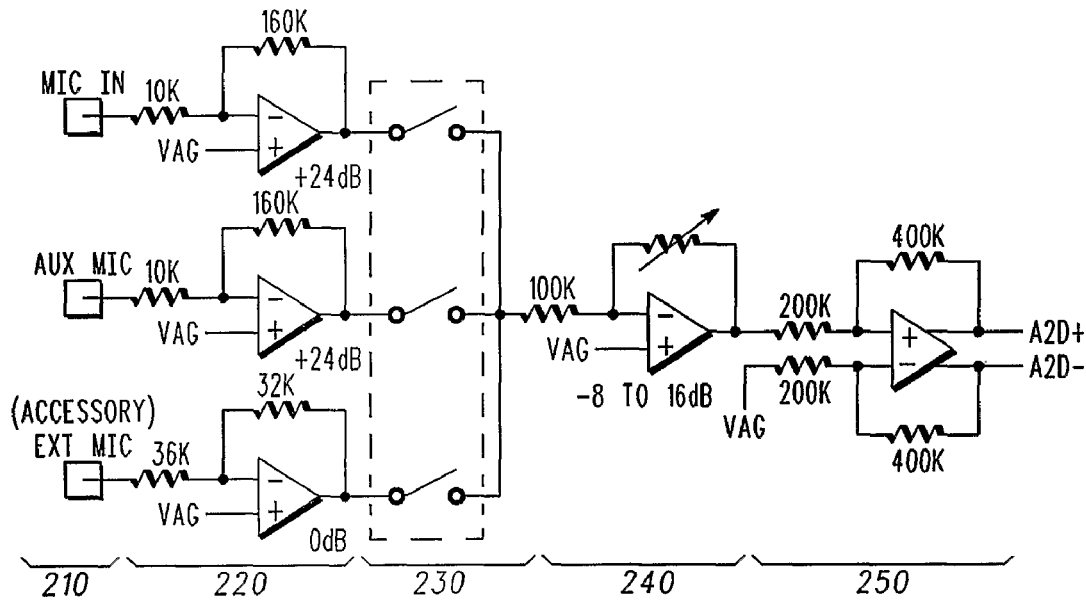
FIG. 2 -PRIOR ART-
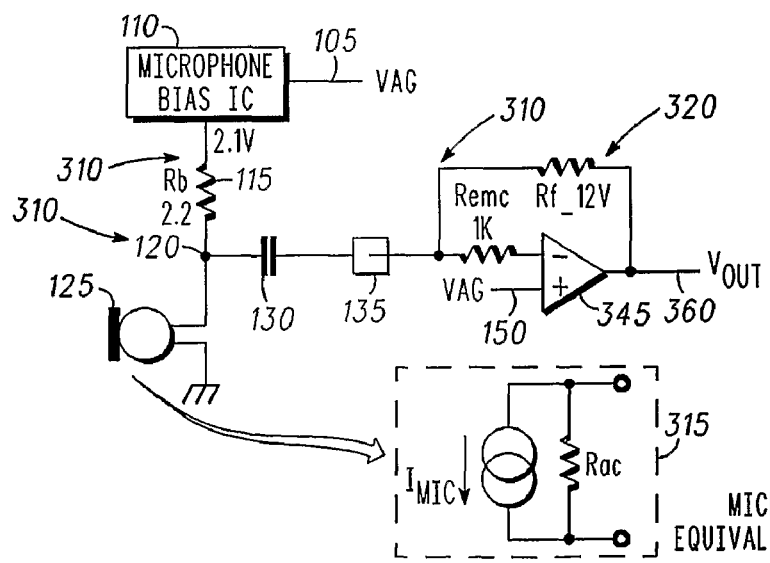
FIG. 3
MICROPHONE EQUIVALENT CIRCUIT

MICROPHONE AMPLIFICATION ARRANGEMENT AND INTEGRATED CIRCUIT THEREFOR

FIELD OF THE INVENTION

This invention relates to microphone amplifiers. The invention is applicable to, but not limited to, provision of a multi-mode microphone amplification arrangement.

BACKGROUND OF THE INVENTION

There is a wide use of amplifiers in today's electronic circuits. One type of amplifier, known as a "pre-amplifier," is typically used to amplify ("preamplify") an unrefined, weak signal that is received from some source, such as a microphone transducer. In a microphone usage, the comparatively small input voltage signal is provided by a microphone transducer to an amplifier referred to as a microphone pre-amplifier. The microphone pre-amplifier amplifies the input analogue audio signal to provide a larger-amplitude "preamplified" output signal that has the same waveform as the input signal, within a particular tolerance.

The preamplified signal is then passed on to a further amplification and/or signal processing stages. For example, the pre-amplified signal may be processed by further components, such as an automatic gain control (AGC) circuit or other components or stages. The pre-amplified signal is often further amplified by an amplifier, to drive an output device, such as a loudspeaker. Other uses may also be made of the preamplified signal.

As the voltage signal input into a pre-amplifier is weak, it is important for microphone pre-amplifiers, as well as other amplifiers that amplify weak input signals, to have a very good noise performance. If not, the noise, which may be significant in comparison to the small input signal, may dominate the amplified output signal. Noise arises in a variety of ways. For example, in amplifiers (including pre-amplifiers) implemented as part of an integrated circuit (IC) having a substrate, noise can arise from comparatively noisy sections of the substrate and thus adversely affect the amplifier portions of the IC.

Noise may also be generated when unavoidable parasitics, associated with silicon ICs, provide numerous paths for unwanted disturbances to couple into the signal path of an analog circuit via the substrate, the power supply rails, the ground lines, and/or even directly from nonideal components. Noise may accompany the input signal if the input lines that deliver the input signal from the microphone transducer pick up noise from a source external to the IC. Such noise may emanate from, for example, a noisy power supply that powers a transducer such as a microphone. Feedback resistors may also introduce thermal noise into the input signal path. The input stage of the amplifier itself may also introduce thermal noise and so-called "flick" noise.

It is also known that sources of noise that are not intrinsic to the silicon components are often reduced by employing well-known techniques, such as: shielding (external to the IC), proper decoupling of power supplies, proper layout of sensitive signals and grounds, isolating active components from noisy substrate. However, the noise sources associated with each silicon component (resistor, transistor), which we can refer to as intrinsic noise sources (thermal noise and flick noise), cannot be reduced unless we accept a very large penalty in terms of current consumption and die size, which is clearly unacceptable for low cost, portable applications.

Noise may thus be introduced into the signal path of an amplifier (or preamplifier), and be amplified along with the input signal, thus causing the amplified (pre-amplified) output signal to be a distorted representation of the input waveform. Such disturbances and distortions can accumulate, potentially leading to serious loss in signal-to-noise ratio and dynamic range of the microphone design.

Referring now to FIG. 1, a classical microphone amplification arrangement 100 is illustrated. The classical microphone arrangement 100 comprises a microphone transducer 125. Notably, the remaining circuitry to support the use of the microphone transducer is inherently dictated by the specifications set by the microphone transducer manufacturer. In particular, the microphone transducer manufacturer specifies a voltage output signal to be supplied to bias the microphone at location 120, as well as the sensitivity (gain) of the microphone. Consequently, this dictates the bias resistor $R_b$ 115 value and specification, as well as the microphone bias IC 110.

The microphone voltage $V_{mic}$ at location 120 is created by the microphone current and is set by the dc bias, the value of $R_b$ 115 and the dc current drawn by the microphone transducer 125.

The microphone bias IC 110 is a small low-noise voltage regulator, which is configured to provide, say, a regulated 2.1V in accordance with the microphone transducer manufacturer's specification of supply voltage. The microphone bias IC 110 is supplied by a further low noise reference voltage (VAG) 105. The low noise reference voltage (VAG) 105 is equivalent to a voltage regulator with limited current capability. Often, this voltage level is set to half of the supply voltage, to facilitate maximum swing of the voltage being modulated.

The standard microphone amplifier circuit is a voltage-to-voltage (V2V) circuit, as the microphone current $I_{mic}$ is first transformed into a voltage $V_{mic}$ and the amplification $V_{out}/V_{mic}$ involves signals in a voltage form. The microphone transducer and associated bias circuitry is typically coupled to a microphone amplifier integrated circuit (IC), via a large external capacitance 130 and an IC pin 135.

The microphone amplifier IC comprises an input resistor $R_{in}$ 140, a preamplifier 145 and feedback network comprising a feedback resistor 155. The amplified audio output signal 160 is output from the pre-amplifier 145.

The standard arrangement in a V2V microphone amplifier is that the preamplifier is configured as an inverting amplifier, which amplifies the voltage at the microphone with a gain $R_f/R_{in}$.

This classical amplification arrangement is referred to as a voltage to voltage (V2V) amplification because the microphone signal $I_{mic}$ resulting from the acoustic-to-electric conversion is first transformed into a voltage, before being amplified by the preamplifier 145. The global sensitivity (gain) of the microphone and pre-amplifier is illustrated below in equation [1].

$$\frac{V_{out}}{I_{mic}} = \frac{V_{out}}{V_{mic}} \cdot \frac{V_{mic}}{I_{mic}} = \frac{R_{fv2v}}{R_{in}} \cdot (R_{in} // R_b // R_{ac}) \qquad [1]$$

In, for example, the field of photonics, it is known to use a current-to-voltage (I2V) circuit to convert current produced by photo-diodes into a voltage. Here, a pre-amplifier and feedback path is also used. However, no input resistance is used.

Referring now to FIG. 2, a classical microphone amplification system 200 is illustrated. The classical microphone amplification system 200 is suitable for mobile phone use and comprises a series of audio/microphone inputs 210, such as microphone input, auxiliary microphone and an external microphone. Each of the microphone inputs 210 are input to a respective low-noise pre-amplifier arrangement 220. Each of the low-noise pre-amplifiers is illustrated as a V2V conversion arrangement, which has evolved to be the de-facto standard in microphone amplification.

The low-noise pre-amplifier arrangement 220 has respective output ports to an analogue multiplexer 230 that is under control of the mobile phone controller to select the microphone input to be processed and transmit.

The analogue multiplexer 230 has a single output to a programmable gain amplifier 240 to amplify the audio signal to a level that is sufficient for processing and yet is undistorted. The programmable gain amplifier 240 outputs the amplified audio signal to a single-to-differential amplifier (converter) plus anti-aliasing filter for subsequent data conversion by an analogue-to-digital converter 250.

However, although the aforementioned microphone amplification system uses low-noise pre-amplifiers, the product manufacturers who utilize such microphone amplification systems, such as mobile phone manufacturers are requiring improvements in reducing noise. This is particularly the case for provision of future technologies and features where audio sensitivity to noise has been identified as a key user requirement.

Thus, there exists a need to improve the noise performance in microphone amplification systems. In addition, there is a need to support existing microphone amplifier applications that use the standard V2V approach. Furthermore, any solution needs to be capable of providing adequate electro-magnetic interference (EMI) protection.

STATEMENT OF INVENTION

In accordance with the preferred embodiment of the present invention, there is provided a microphone amplifier arrangement and an integrated circuit therefor, as claimed in the accompanying Claims.

BRIEF DESCRIPTION OF THE DRAWINGS

FIG. 1 illustrates a classic (V2V) microphone amplifier topology; and

FIG. 2 illustrates a known microphone amplification system.

Figure 4:
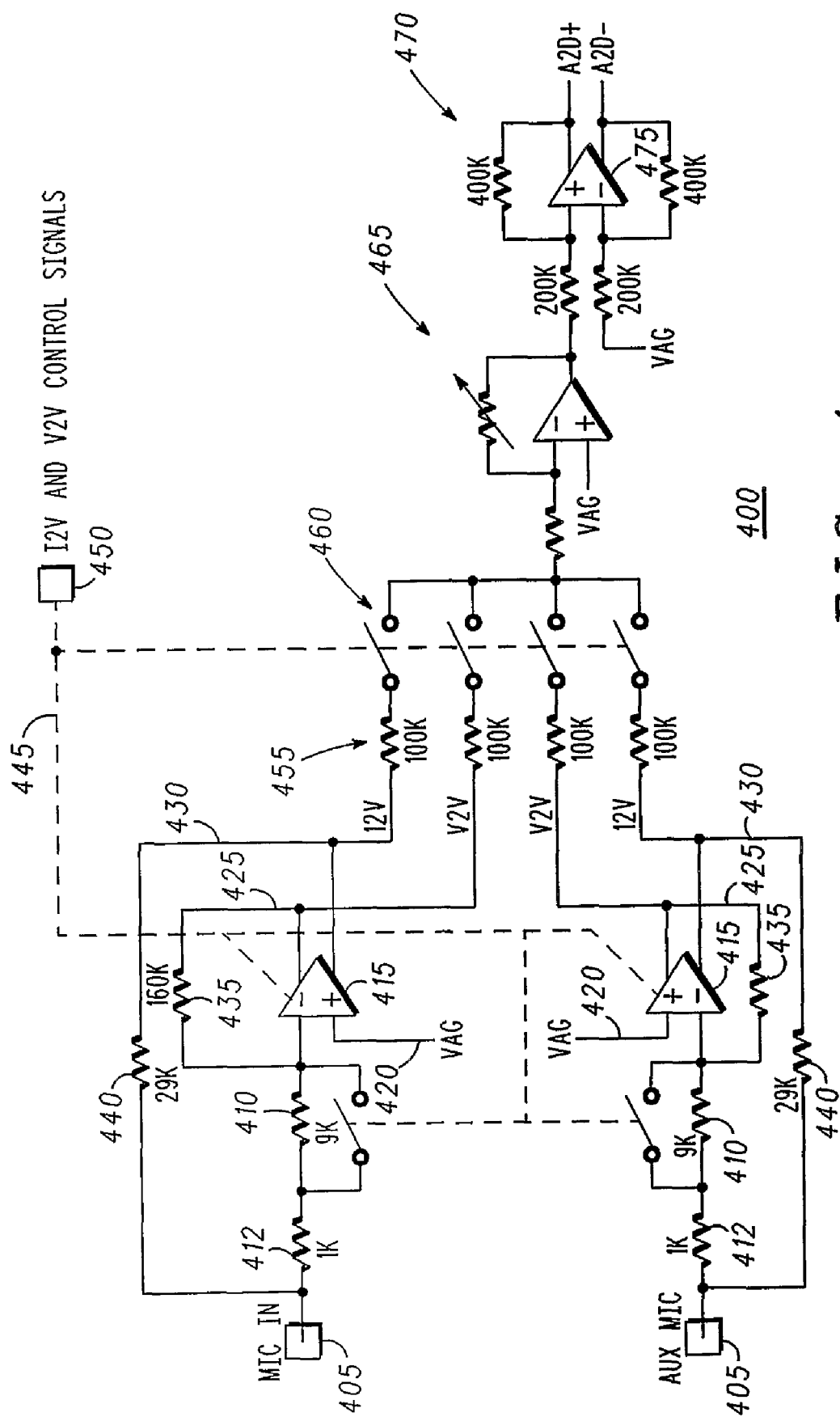

Embodiments of the present invention will now be described, by way of example only, with reference to the accompanying drawings, in which:

FIG. 3 illustrates an I2V microphone amplifier arrangement utilised in accordance with a preferred embodiment of the present invention; and FIG. 4 illustrates a multimode microphone amplification arrangement in accordance with the preferred embodiment of the present invention.

DESCRIPTION OF PREFERRED EMBODIMENTS

In summary, the preferred embodiment of the present invention provides a microphone amplification system that supports existing V2V microphone amplifier applications as well as incorporating a selectable low-noise I2V implementation. Advantageously, the proposed microphone amplification system uses only one amplifier core and provides sufficient EMI protection.

In mobile phone applications, the microphone is usually an electret condenser microphone, which can be considered as a current source whose value changes with the acoustic pressure applied on the diaphragm. The equivalent circuit includes an equivalent resistance, which is made of the microphone internal resistance $R_{ac}$ in parallel with the biasing resistance $R_b$ and the input resistance $R_{in}$ of the associated pre-amplifier. The microphone internal resistance $R_{ac}$ and the biasing resistance $R_b$ are set by the microphone manufacturer. Typically $R_{ac} >> R_b$ and $R_b$=2.2 k.

Hence, the inventors of the present invention have targeted the removal of the input resistance, in instances where low noise microphone amplification is required. The input resistance has been identified as a major noise contributor, which in known microphone amplification systems is always used as a need to comply with the de-facto standard of using a V2V approach. Consequently, in order to move away from the use of an input resistance, a I2V approach is adopted.

The proposed I2V microphone amplifier 300 is illustrated in FIG. 3. The preferred I2V microphone amplifier design 300 comprises a microphone transducer 125. The microphone transducer is provided with a bias supply from a reference voltage 105, which is further regulated by a microphone bias voltage regulator 110 in the known manner, and bias resistor Rb 115. In the I2V microphone amplifier design 300 the sensitivity is set by the amplifier feedback resistor alone. The microphone transducer and associated bias circuitry are coupled to a microphone amplifier integrated circuit (IC), via a large external capacitance 130 and an IC pin 135, as in the known manner.

Notably, the locations 310 are all AC grounds. The microphone DC voltage $V_{mic}$ at location 120 is created by the microphone current and is set by the dc bias, the value of Rb 115 and the dc current drawn by the microphone transducer 125. $R_{ac}$ 315 is an active resistance that must be accounted for only in an AC context (not in DC). Moreover, in the proposed I2V arrangement, $R_{ac}$ has no effect in an AC context, as it is connected between 2 AC grounds and as such no AC current can flow into it.

In accordance with the preferred embodiment of the present invention, the microphone amplifier IC comprises an I2V arrangement, whereby a current to voltage conversion is effected via the feedback resistor 320. Notably, no input resistance $R_{in}$ is used. An EMC resistance ($R_{emc}$) is, however, incorporated between the IC pin and a high gain input transistor(s) of the pre-amplifier, in order to prevent demodulation of radio frequency (RF) signals. Notably, this is not equivalent to $R_{in}$. Advantageously, the value of $R_{emc}$ in an I2V arrangement can be made smaller than the value of $R_{in}$ in a V2V arrangement as $R_{emc}$ in I2V is not involved in the sensitivity equation. $R_{emc}$ in an I2V arrangement is only included to prevent demodulation of radio frequency (RF) signals. Typically, and advantageously, a value for $R_{emc}$ can be made to be 1/10 of $R_{in}$, thereby providing a much smaller noise contribution The amplified audio output signal 360 is then output from the pre-amplifier 345.

Thus, in summary, the microphone signal $I_{mic}$ to be amplified is directly converted into a voltage at the output of the pre-amplifier 345. Advantageously, the I2V design makes the global sensitivity (gain) provided by the microphone and pre-amplifier equal to the feedback resistor ($R_{f\_I2V}$). Notably, this is independent of $R_{ac}$ and $R_b$.

In order to better appreciate the noise benefits provided by an I2V approach, as compared to the standard V2V approach, the two techniques (V2V and I2V) are compared below assuming they have the same global sensitivity (gain of the microphone and pre-amplifier).

For a Microphone bias: $V_{mb}$ (intrinsic) noise source:

$$\frac{R_{fv2v} \cdot R_{ac}}{R_{in} \cdot R_{ac} + R_b \cdot R_{ac} + R_{in} \cdot R_b} = \frac{R_{fi2v}}{R_b}$$

For a Bias Resistor: $V_{rb}$ noise source:

$$\frac{R_{fv2v} \cdot R_{ac}}{R_{in} \cdot R_{ac} + R_b \cdot R_{ac} + R_{in} \cdot R_b} = \frac{R_{fi2v}}{R_b}$$

For a MicAmp: ($V_{amp}$) noise source:

$$1 + \frac{R_{fv2v} \cdot (R_{ac} + R_b)}{R_{in} \cdot R_{ac} + R_b \cdot R_{ac} + R_{in} \cdot R_b} = 1 + \frac{R_{fi2v} \cdot (R_{ac} + R_b)}{R_b \cdot R_{ac}}$$

Thus, the microphone bias generator, the biasing resistor and the amplifier all have the same noise contribution with an I2V or a V2V approach at the output of the pre-amplifier.

However, when comparing the noise contribution of the feedback resistor ($V_{rf}$), the V2V amplification factor equals the I2V amplification factor, which equals '1'. Consequently, the noise of the feedback resistance is amplified with the same gain in both the V2V and I2V approaches.

However, and notably, the noise contribution at the output is much lower in the I2V approach as a result of a much smaller resistance that is needed to achieve the same sensitivity. In effect, the same sensitivity is achieved in I2V with a feedback resistance 5.5 times smaller than in V2V and advantageously without any need for an input resistance $R_{in}$. With a '5.5' times smaller feedback resistance a '2.34' times lower noise level (in $V_{rms}$) is achieved.

Furthermore, the noise source of the input resistance ($VR_{in}$) is zero in the I2V approach, but is amplified with a factor of:

$$\frac{R_{fv2v} \cdot (R_{ac} + R_b)}{R_{in} \cdot R_{ac} + R_b \cdot R_{ac} + R_{in} \cdot R_b}$$

in the V2V amplification approach.

Of particular benefit with the I2V approach is that the input resistance $R_{in}$, which is the number one noise contributor in V2V, does not exist in an I2V approach.

Referring now to FIG. 4, a microphone amplification system 400 according to the preferred embodiment of the present invention is illustrated. The microphone amplification system 400 comprises two inputs, for exemplary purposes only, including a microphone input port and an auxiliary microphone input 405. Both inputs are, in effect, substantially connected to the same circuitry in a parallel configuration.

The microphone inputs are connected to a negative terminal of a dual output microphone pre-amplifier 415 that has a reference voltage (VAG) 420 connected to the positive terminal. Dual output pre-amplifiers 415 are used to support both a V2V microphone amplifier arrangement as well as an I2V microphone amplifier arrangement.

In this regard, a first output of the dual output pre-amplifier 415 is connected to first feedback path 425 comprising a V2V feedback resistor 435. An input resistance $R_{in}$ of say 10 kohm comprises a first resistance 410, of say, 9 kohm and a second resistance $R_{emc}$ 412 of, say, 1 Kohm. Both resistors (in series) couple the microphone input signal to the negative terminal of the pre-amplifier 415, which is also coupled to the V2V feedback resistor 435. Note that, in effect, $R_{emc}$=1 kohm is a subset of $R_{in}$=10K, as $R_{in}$ is implemented as a serial arrangement of two resistances. Notably, the 9 kohm first resistance 410 is shorted during I2V operation.

A second output of the dual output pre-amplifier 415 is connected to a second feedback path 430 comprising an I2V feedback resistor 440. In this configuration, the I2V-V2V control signal shorts out the 9 Kohm input resistance leaving an EMC resistance $R_{emc}$ 412 in this configuration. This resistance $R_{emc}$ 412 couples the microphone input signal and the I2V feedback signal to the negative terminal of the pre-amplifier 415.

The selection of the operational path of either microphone inputs and the operation of either of the outputs of the dual output amplifier 415 is controlled by the controller 450 via control lines 445.

It is envisaged that the selection of the operational path of either microphone inputs and the operation of either of the outputs of the dual output amplifier 415 will preferably be fixed and defined during manufacture of the chip-set. For example, it is typical for wireless communication manufacturers to re-use the same ICs across a number of platforms. Thus, the same power supply IC will often be used on low-tier, mid-tier and high-tier mobile phones. In such a case, the low-tier phone may be pre-configured to use the standard V2V design, whereas a mid-tier and/or high-tier phone may be pre-configured to use the low-noise I2V design, to offer an improved noise performance.

However, it is envisaged that the selection between a use of an I2V or a V2V circuit may be performed automatically or be user-controlled. For example, it is envisaged that the user may be able to initiate a switch from the V2V circuit to a low-noise I2V circuit upon recognising a poor noise performance of a microphone input signal. Alternatively, if the controller 450 is able to receive a signal indicative of the noise performance of the IC components, the controller may be configured to automatically switch the circuit operation to, or from, a low noise I2V mode of operation.

The outputs of the respective dual amplifier I2V and V2V outputs are connected to a combined programmable gain amplifier 465 and analogue multiplexer arrangement 455. The selection of which microphone input and corresponding output of one of the dual output amplifiers 415 is again controlled by the controller 450 via control line 445 and a bank of switches 460.

The output of the programmable gain amplifier 465 is input to a single-to-differential amplifier arrangement 470, which preferably comprises anti-aliasing filtering 475. The use of differential processing is a common practice for A/D conversion, as it allows better immunity against supply and ground noise. The dual outputs of the single to differential amplifier arrangement 470 are then input to an analogue-to-digital converter for converting to digital signals for processing and transmission.

By appropriate programming of the controller 450, a user of the microphone is able to dynamically switch seamlessly between using a V2V microphone amplifier arrangement and an I2V microphone amplifier arrangement. This is facilitated by use of parallel I2V and V2V circuits, being input to a dual output amplifier and employing a dual feedback loop. A resistance (that includes $R_{emc}$ 412) couples the microphone input to the dual output amplifier and operates as an input resistance for V2V application as well as an EMC desensing resistance $R_{emc}$ 412 with a short circuit of $R_{in}$ 410 for the I2V application.

Advantageously, the programmable gain amplifier 465 and analogue multiplexer arrangement 455 are combined into a single function, controlled by the user.

Of course, the various components within the microphone amplification system 400 can be arranged in any suitable functional topology able to utilise the inventive concepts of the present invention. Furthermore, the various components within the microphone amplification system 400 can be realised in discrete or integrated component form, with an ultimate structure therefore being merely an application-specific selection.

It is within the contemplation of the present invention that the inventive concept may be implemented on an integrated circuit (IC) and/or application specific integrated circuit (ASIC) and/or any other sub-system element. Furthermore, it is envisaged that the inventive concept hereinbefore described is applicable to any microphone amplifier arrangement, such as those used in audio management ICs or baseband interface ICs.

The microphone amplification system and integrated circuit therefor, as described above, aims to provide at least one or more of the following advantages:
(i) A lower noise microphone amplifier performance is achieved using a new I2V approach;
(ii) A selection between a low-noise I2V approach and the standard V2V microphone amplifier arrangements is provided for. Advantageously, such a technique supports backward compatibility of the de-facto V2V approach whilst evolving to a low-noise I2V approach;
(iii) The same IC can be used for both I2V and V2V designs;
(iv) The I2V method is made EMC robust by the addition of a resistor at the amplifier input and a short circuit to short out the input resistance in the V2V circuit; and
(v) The use of dual output amplifiers requires only a minor increase in size, whilst offering the advantage of being able to select either I2V and V2V modes of operation.

Whilst specific, and preferred, implementations of the present invention are described above, it is clear that one skilled in the art could readily apply variations and modifications of such inventive concepts.

Thus, microphone amplification system and integrated circuit therefor, has been described wherein the abovementioned disadvantages associated with prior art arrangements has been substantially alleviated.

The invention claimed is:

1. A microphone amplifier arrangement comprising:
at least one microphone input connected to a dual output microphone pre-amplifier having an input resistance comprising a first resistance and a second resistance in a first voltage-to-voltage mode of operation, and only the second resistance in a second current-to-voltage mode of operation;
a first output is operably coupled to a first feedback path comprising a voltage-to-voltage feedback resistor; and
a second output is operably coupled to a second feedback path comprising a current-to-voltage feedback resistor, arranged to support both a voltage-to-voltage microphone amplifier and a current-to-voltage microphone amplifier.

2. A microphone amplifier arrangement according to claim 1 further comprising a controller operably coupled to the dual output microphone pre-amplifier and arranged to switch an operation of the dual output microphone pre-amplifier between a voltage-to-voltage mode and a current-to-voltage mode of operation.

3. A microphone amplifier arrangement according to claim 2 wherein the controller switches the dual output microphone pre-amplifier to operate in a low noise mode using the second feedback path.

4. A microphone amplifier arrangement according to claim 3 wherein the controller short circuits the first resistance to operate in a current-to-voltage mode of operation.

5. A microphone amplifier arrangement according to claim 3, wherein two or more dual output microphone pre-amplifiers are connected to the controller in parallel, such that either, or any, of the dual output microphone pre-amplifiers are operable as a voltage-to-voltage or current-to-voltage microphone amplifier.

6. A microphone amplifier arrangement according to claim 3, wherein the outputs of the dual output microphone pre-amplifier being operably coupled to a combined programmable gain amplifier and analogue multiplexer arrangement.

7. An integrated circuit characterised by the microphone amplification system according to claim 3.

8. A microphone amplifier arrangement according to claim 2 wherein the controller short circuits the first resistance to operate in the current-to-voltage mode of operation.

9. A microphone amplifier arrangement according to claim 8, wherein two or more dual output microphone pre-amplifiers are connected to the controller in parallel, such that either, or any, of the dual output microphone pre-amplifiers are operable as a voltage-to-voltage or current-to-voltage microphone amplifier.

10. A microphone amplifier arrangement according to claim 8, wherein the outputs of the dual output microphone pre-amplifier being operably coupled to a combined programmable gain amplifier and analogue multiplexer arrangement.

11. An integrated circuit characterised by the microphone amplification system according to claim 8.

12. A microphone amplifier arrangement according to claim 2, wherein two or more dual output microphone pre-amplifiers are connected to the controller in parallel, such that either, or any, of the dual output microphone pre-amplifiers are operable as a voltage-to-voltage or current-to-voltage microphone amplifier.

13. An integrated circuit characterised by the microphone amplification system according to claim 12.

14. A microphone amplifier arrangement according to claim 2, wherein the outputs of the dual output microphone pre-amplifier being operably coupled to a combined programmable gain amplifier and analogue multiplexer arrangement.

15. A microphone amplifier arrangement according to claim 14 wherein the combined programmable gain amplifier and analogue multiplexer arrangement is operably coupled to the controller that is arranged to select an output of the dual output microphone pre-amplifier to further amplify and transmit.

16. A microphone amplifier arrangement according to claim 15 wherein the combined programmable gain amplifier and analogue multiplexer arrangement is operably coupled to a single-to-differential amplifier arrangement.

17. A microphone amplifier arrangement according to claim 14 wherein the combined programmable gain amplifier and analogue multiplexer arrangement is operably coupled to a single-to-differential amplifier arrangement.

18. An integrated circuit characterised by the microphone amplification system according to claim 14.

19. An integrated circuit characterised by the microphone amplification system according to claim 2.

20. An integrated circuit characterised by the microphone amplification system according to claim 1.

* * * * *